United States Patent
Kim et al.

(10) Patent No.: US 8,023,339 B2
(45) Date of Patent: Sep. 20, 2011

(54) PIPE LATCH CIRCUIT AND SEMICONDUCTOR MEMORY DEVICE USING THE SAME

(75) Inventors: Youk Hee Kim, Seoul (KR); Bok Rim Ko, Seoul (KR); Young Joo Kim, Hwnseong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 109 days.

(21) Appl. No.: 12/459,106

(22) Filed: Jun. 26, 2009

(65) Prior Publication Data
US 2010/0246279 A1 Sep. 30, 2010

(30) Foreign Application Priority Data
Mar. 30, 2009 (KR) .................. 10-2009-0027001

(51) Int. Cl.
*G11C 11/00* (2006.01)
(52) U.S. Cl. .................. 365/189.05; 365/193
(58) Field of Classification Search ............. 365/189.05, 365/193
See application file for complete search history.

(56) References Cited

U.S. PATENT DOCUMENTS

| 2006/0133158 A1 | 6/2006 | Shin |
| 2007/0223287 A1 | 9/2007 | Lee |
| 2008/0074936 A1 * | 3/2008 | Kim et al. ............ 365/189.15 |

FOREIGN PATENT DOCUMENTS

| KR | 10-0567527 | 3/2006 |
| KR | 10-2008-0058700 A | 6/2008 |

* cited by examiner

*Primary Examiner* — Michael T Tran
(74) *Attorney, Agent, or Firm* — John P. White; Cooper & Dunham LLP

(57) ABSTRACT

A pipe latch circuit comprises a reset signal generating unit which receives a read-write flag signal and a read period signal and generates a reset signal, wherein the reset signal is enabled upon entry into a write operation or after all data are outputted to an outside upon read operation, an input/output control signal generating unit which generates a plurality of input control signals and output control signals in response to a read strobe signal and a clock signal, and is reset in response to the reset signal, and a pipe latch unit which latches inputted data in response to the input control signals and outputs the latched data in response to the output control signals.

21 Claims, 5 Drawing Sheets

PIPE LATCH CIRCUIT AND SEMICONDUCTOR MEMORY DEVICE USING THE SAME

TECHNICAL FIELD

This disclosure relates to a semiconductor memory device, and more particularly, to a pipe latch circuit and a semiconductor memory device using the same.

BACKGROUND

In recent times, manufacturing of semiconductor memory devices continuously advance toward high integration and high speed through improvements of technologies, and such devices are used in a variety of products, from large home appliances to small mobile products. A semiconductor memory device typically consists of a plurality of cells which store data therein.

In general, a synchronous memory is provided with a pipe latch circuit for continuous output of the data. The pipe latch circuit functions to store data transferred from a cell region and sequentially output the data to an output driver in synchronization with a clock signal. In this pipe latch circuit, a number of registers varies as a number of data which the pipe latch circuit receives and latches and the number of registers which form the pipe latch circuit is determined in accordance with a CAS latency of the memory device and the like. Also, on the basis of a control method, the pipe latch circuit is divided into a serial pipe latch circuit in which the registers are serially connected and a parallel pipe latch circuit in which the registers are parallelly connected.

FIG. 1 is a block diagram illustrating a configuration of a conventional pipe latch circuit.

The pipe latch circuit as illustrated in FIG. 1 includes a pipe latch control unit 500 and a pipe latch 600.

The pipe latch control unit 500 receives a read-write flag signal RWF, generates first through fourth input control signals PIN<1:4> for latching data inputted to the pipe latch 600 through the global line GIO, and generates first through fourth output control signals POUT<1:4> for controlling an output of data LD latched in the pipe latch 600. Here, the read-write flag signal RWF is a level signal, which is shifted to a high level upon a read operation and shifted to a low level upon a write operation.

The pipe latch 600 sequentially latches the data inputted thereto through the global line GIO in response to the first through fourth input control signals PIN<1:4>, and outputs the latched data LD in response to the first through fourth output control signals POUT<1:4>. If the pipe latch includes four registers, the first register latches the data in response to the first input control signal PIN<1> inputted first, and outputs the latched data LD in response to the first output control signal POUT<1> inputted next. Likewise, the second through fourth registers latch the data in response to the second through fourth input control signals PIN<2:4>, respectively, and then output the latched data LD in response to the second through fourth output control signals POUT<2:4>, respectively.

Meanwhile, the pipe latch control unit 500 is initialized in a period where the read-write flag signal RWF is shifted from a high level to a low level. That is to say, the first through fourth input control signals PIN<1:4> and the first through fourth output control signals POUT<1:4> are all disabled upon transition from the read operation to the write operation, and the enablement is sequentially performed again from the first input control signal PIN<1> and the first output control signal POUT<1> upon next read operation.

However, when the read operation is continuously performed, the pipe latch control unit 500 is not initialized since the read-write flag signal RWF is continuously maintained at a high level and the first through fourth input control signals PIN<1:4> and the first through fourth output control signals POUT<1:4> are maintained at the level upon the previous read operation. For example, if a previous read operation is terminated in a state that the enablement is performed up to the first input control signal PIN<1> and the first output control signal POUT<1>, the enablement begins sequentially from the second input control signal PIN<2> and the second output control signal POUT<2> upon the next read operation. At this time, if the first through fourth input control signals PIN<1:4> and the first through fourth output control signals POUT<1:4> are not matched with each other, the pipe latch can malfunction and cause a read operation failure. For example, there may occur a problem that, if a next read operation begins in a state that the third input control signal PIN<3> is enabled in the previous read operation, the third output control signal POUT<3> is enabled and invaluable data which has been latched in the previous read operation is outputted.

BRIEF SUMMARY

In an aspect of this disclosure, there are provided a pipe latch circuit which is initialized each time read operation is terminated and allows input/output sequence of data latched in a pipe latch to be always matched, and a semiconductor memory device using the same.

In an embodiment, a pipe latch circuit includes a reset signal generation unit which receives a read-write flag signal and a read period signal and generates a reset signal, wherein the reset signal is enabled upon entry into a write operation or after all data are outputted to an outside upon read operation, an input/output control signal generation unit which generates a plurality of input control signals and output control signals in response to a read strobe signal and a clock signal, and is reset in response to the reset signal, and a pipe latch unit which latches inputted data in response to the input control signals and outputs the latched data in response to the output control signals.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 1:
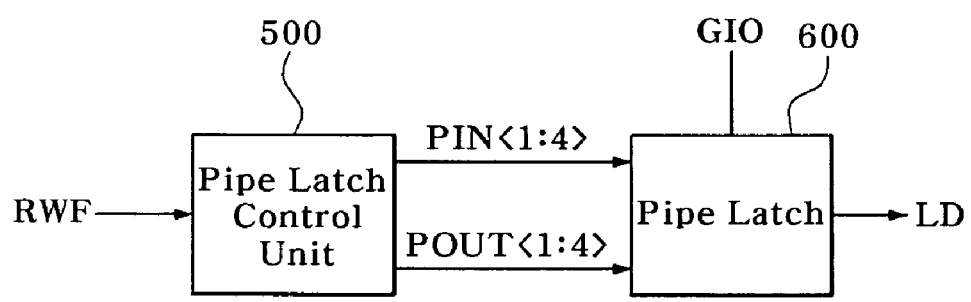
FIG. 1 is a block diagram illustrating a configuration of a conventional pipe latch circuit.
Figure 2:
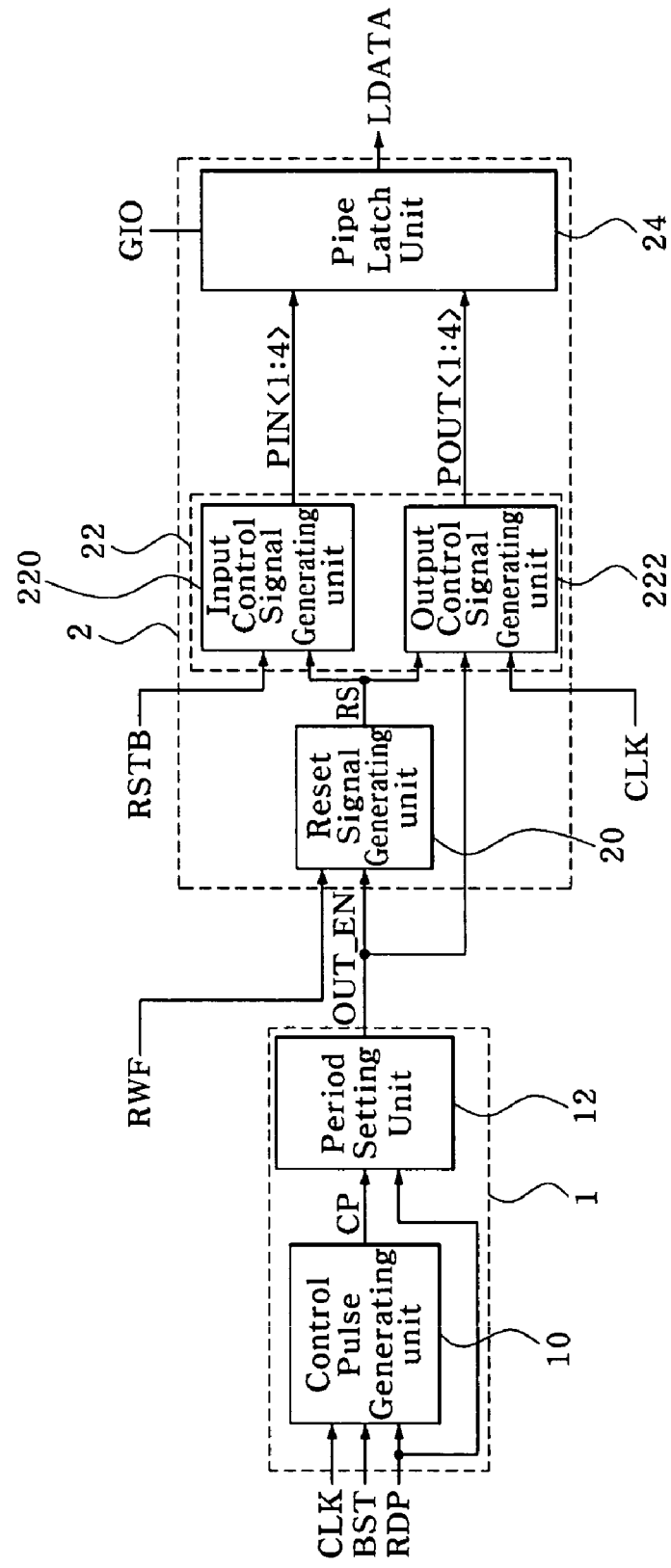
FIG. 2 is a block diagram illustrating a configuration of a semiconductor memory device in accordance with an embodiment of the present invention.

FIG. 2 is a block diagram illustrating a configuration of a semiconductor memory device in accordance with an embodiment of the present invention.

The semiconductor memory device illustrated in FIG. 2 comprises a read period signal generating unit 1 and a pipe latch circuit 2.

The read period signal generation unit 1 comprises a control pulse generating unit 10 and a period setting unit 12.

Figure 3:
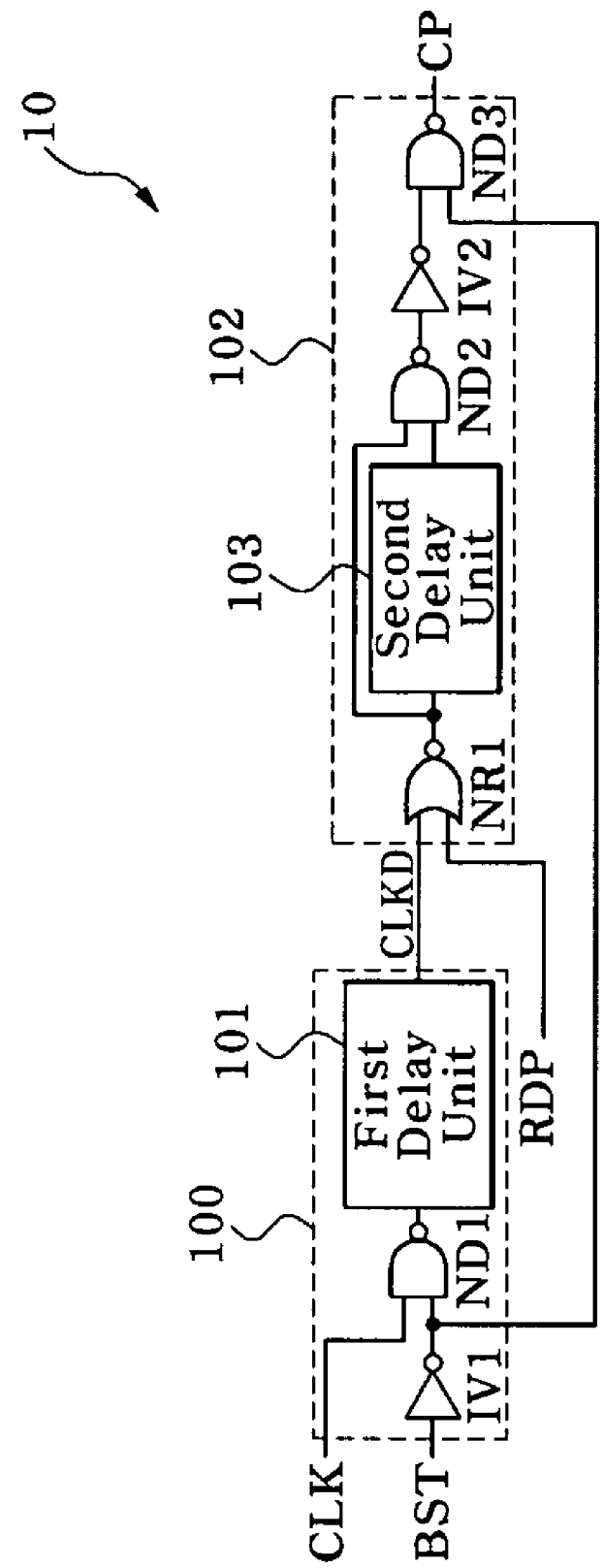
FIG. 3 is a circuit diagram illustrating a control pulse generating unit in the semiconductor memory device shown in FIG. 2.

The control pulse generating unit 10 can comprise, as illustrated in FIG. 3, a first logic unit 100 configured to receive a clock signal CLK and a burst signal BST and generate a delayed clock signal CLKD, and a second logic unit 102 configured to receive the delayed clock signal CLKD, the burst signal BST and a read pulse RDP and generate a control pulse CP. Here, the read pulse RDP is a pulse signal of a high level generated when a read command is inputted. Also, the burst signal BST is enabled to a high level after the read pulse is inputted and one cycle period of the clock signal CLK is elapsed, and is disabled to a low level after a burst operation is terminated.

The first logic unit 100 includes a NAND gate ND1 which performs a logic NAND operation on an inverted signal (from inverter IV1) of the burst signal BST and the clock signal CLK and a first delay unit 101 which delays an output signal of the NAND gate ND1 by a first delay period and outputs the delayed clock signal CLKD. Here, the delayed clock signal CLKD is shifted to a high level after being delayed by the first delay period of the first delay unit 101 when the burst signal BST is enabled to a high level, and maintained at a high level during the enable period of the burst signal BST.

The second logic unit 102 includes a NOR gate NR1 which performs a NOR operation on the delayed clock signal CLKD and the read pulse RDP, a second delay unit 103 which delays an output signal of the NOR gate NR1 by a second delay period, a NAND gate ND2 which performs a logic NAND operation on the output signal of the NOR gate NR1 and an output signal of the second delay unit 103, an inverter IV2 which inverts an output signal of the NAND gate ND2, and a NAND gate ND3 which performs a logic NAND operation on an output signal of the inverter IV2 and the inverted signal of the burst signal BST and generates the control pulse CP. The control pulse CP is enabled to a high level when the read pulse RDP is inputted upon entry into the read operation, and is disabled to a low level after a burst operation period is terminated and the first delay period and the second delay period are elapsed.

Figure 4:
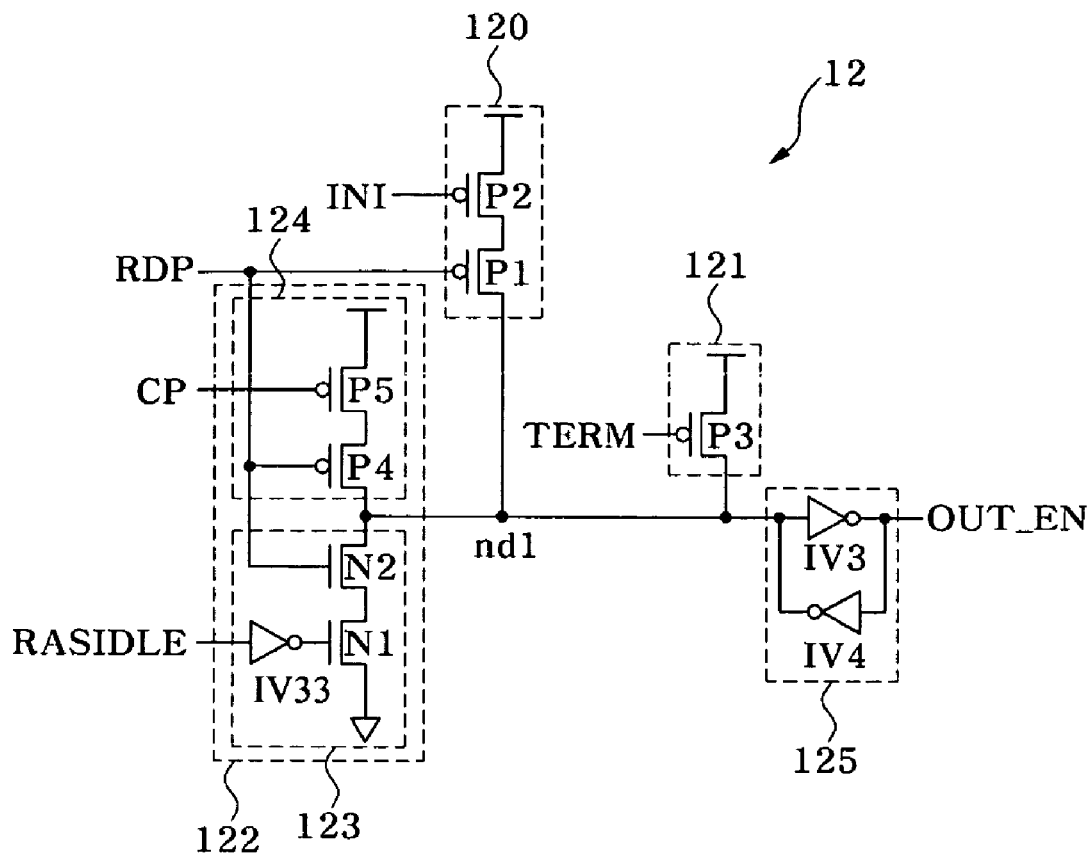
FIG. 4 is a circuit diagram illustrating a period setting unit in the semiconductor memory device shown in FIG. 2.

Meanwhile, the period setting unit 12 can include, as illustrated in FIG. 4, a first initialization unit 120, a second initialization unit 121, a level setting unit 122 and a latch unit 125.

The first initialization unit 120 includes a PMOS transistor P1 turned on in response to the read pulse RDP and a PMOS transistor P2 turned on in response to an initialization signal INI. Here, the initialization signal INI is a low pulse signal generated upon power-up. That is to say, the first initialization unit 120 initializes a node nd1 to a high level in response to the read pulse RDP of a low level and the initialization signal INI of a low level upon the power-up.

The second initialization unit 121 includes a PMOS transistor P3 which is turned on in response to an interrupt termination signal TERM enabled to a low level upon generation of an interrupt. For example, the second initialization unit 121 initializes the node nd1 to a high level upon generation of the interrupt, such as input of write command during the read operation.

The level setting unit 122 includes a pull-down unit 123 which pulls down the node nd1 in response to a RAS idle signal RASIDLE and the read pulse RDP and a pull-up unit 124 which pulls up the node nd1 in response to the read pulse RDP and the control pulse CP. Here, the RAS idle signal RASIDLE is at a high level in a state that all banks are not activated, and is shifted to a low level when at least one bank is activated.

The pull-down unit 123 includes an NMOS transistor N1 turned on in response to the RAS idle signal RASIDLE of a low level (via inverter IV33) when at least one bank is activated and an NMOS transistor N2 turned on when the read pulse RDP is enabled to a high level. That is to say, the node nd1 is pulled down when the bank is activated and the read pulse RDP is inputted.

The pull-up unit 124 includes a PMOS transistor P4 turned on when the read pulse RDP is at a low level and a PMOS transistor P5 turned on when the control pulse CP is at a low level. That is to say, the node nd1 is pulled up when the high enable period of the control pulse CP is terminated.

As such, upon the read operation, the level setting unit 122 pulls down the node nd1 when the read pulse RDP is inputted and pulls up the node nd1 when the control pulse CP is disabled to a low level.

The latch unit 125 (comprised of inverters IV3 and IV4) latches a signal of the node nd1 and generates a read period signal OUT_EN.

The read period signal generating unit 1 configured as described above generates the read period signal OUT_EN which has a high enable period from after the read pulse RDP is inputted until the control pulse is disabled to a low level. That is to say, the read period signal OUT_EN is maintained in the enable period until the semiconductor memory device enters into the read operation and all of the data are substantially outputted to the outside.

The pipe latch circuit 2, as shown in FIG. 2, can include a reset signal generating unit 20, an input/output control signal generating unit 22 and a pipe latch unit 24.

Figure 5:
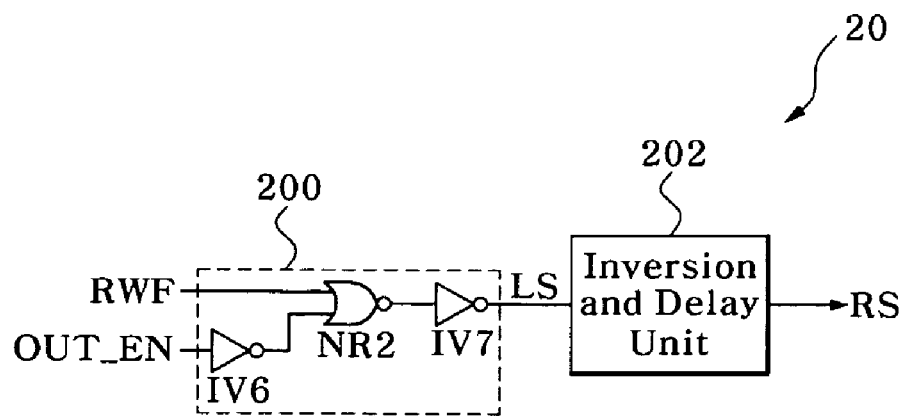
FIG. 5 is a circuit diagram illustrating a reset signal generating unit in the semiconductor memory device shown in FIG. 2.
Figure 6:
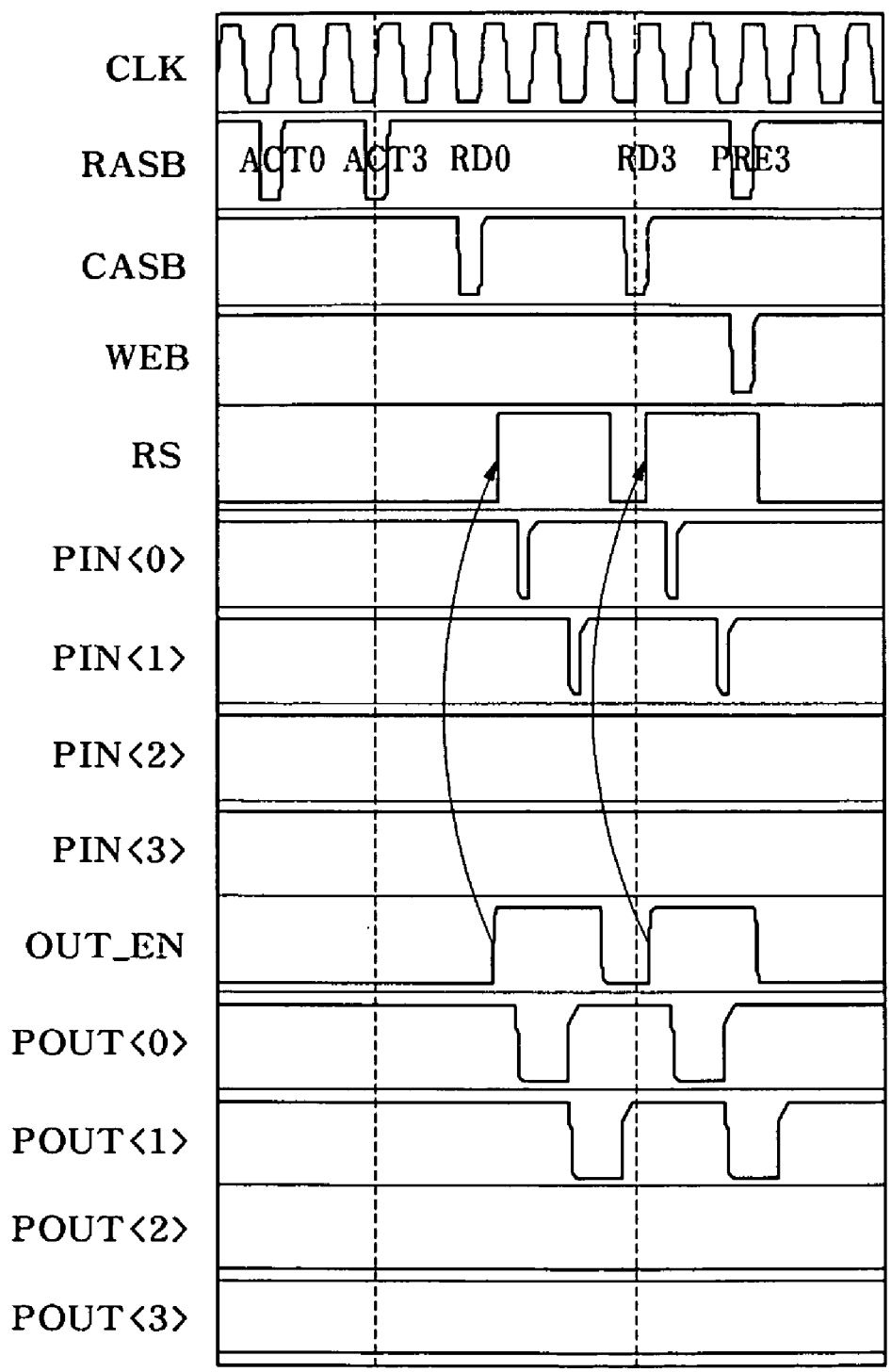
FIG. 6 is a waveform illustrating operation of the semiconductor memory device shown in FIG. 2.

The reset signal generating unit 20, as shown in FIG. 5, can include a level signal generating unit 200 and an inversion and delay unit 202.

The level signal generating unit 200 can include, as illustrated in FIG. 5, a NOR gate NR2 which performs a logic NOR operation on the read-write flag signal RWF and an inverted signal (from inverter IV6) of the read period signal OUT_EN, and an inverter IV7 which inverts an output signal of the NOR gate NR2 and generates a level signal LS. That is to say, the level signal LS is disabled to a low level during a high enable period of the read period signal OUT_EN upon the read operation, and is enabled to a high level when the enable period of the read period signal OUT_EN is terminated. Also, the level signal LS is enabled to a high level when the read-write flag signal RWF is shifted to a high level upon the write operation.

The inversion and delay unit 202 inverts and delays the level signal LS and generates a reset signal RS.

As such, the reset signal generating unit 20 generates the reset signal RS which is enabled to a low level upon entry into the write operation or after all of the data are outputted to the outside upon the read operation.

Meanwhile, the input/output control signal generating unit 22 can include, as illustrated in FIG. 2, an input control signal generating unit 220 and an output control signal generating unit 222.

The input control signal generating unit 220 generates first through fourth input control signals PIN<1:4> sequentially enabled in synchronization with a read strobe signal RSTB during a disable period of the reset signal RS, and initializes all of the first through fourth input control signals PIN<1:4> to a disabled state when the reset signal RS is enabled to a low level upon the termination of the read operation. The first through fourth input control signals PIN<1:4> are sequentially enabled again upon the next read operation. Here, the read strobe signal RSTB is a pulse signal which is generated with the same cycle as the clock CLK after the read command is inputted and a predetermined period is elapsed.

The output control signal generating unit 222 generates first through fourth output control signals POUT<1:4> sequentially enabled in synchronization with the clock signal CLK during the disable period of the reset signal RS, and initializes all of the first through fourth output control signals POUT<1:4> by disabling them to a low level when the reset signal RS is enabled to a low level upon the termination of the read operation. The first through fourth output control signals POUT<1:4> are sequentially enabled again upon the next read operation.

As such, the input/output control signal generating unit 22 sequentially enables the first through fourth input control signals PIN<1:4> and sequentially enables the first through fourth output control signals POUT<1:4> upon the read operation, and initializes all of the first through fourth input control signals PIN<1:4> and the first through fourth output control signals POUT<1:4> when output of the read data is substantially terminated and the reset signal RS is enabled to a low level.

The pipe latch unit 24 including first through fourth registers (not illustrated) latches data inputted through the global line GIO upon the read operation to the first through fourth registers in response to the first through fourth input control signals PIN<1:4>, respectively, and sequentially outputs the latched data LDATA to an output driver (not illustrated) in response to the first through fourth output control signals POUT<1:4>.

Hereinafter, operation of the semiconductor memory device configured as described above before the read operation and upon the read operation will be described with reference to FIGS. 2 to 6.

First, operation of the semiconductor memory device before the read operation will be described.

Referring to FIGS. 2 and 3, in operation of the control pulse generating unit 10, the read pulse RDP and the burst signal BST are all at a low level before the read operation. Since the NAND gate ND1 of the first logic unit 100 operates together with the inverter IV1, the clock signal is delayed by the first delay period of the first delay unit 101 and outputted as the delayed clock signal CLKD. Also, since the NOR gate NR1 and the NAND gate ND3 operate together with the inverter IV2, the delayed clock signal CLKD is adjusted to have a pulse width shortened by the second delay period of the second delay unit 103 and outputted as the control pulse CP.

That is to say, the control pulse generating unit 10 generates the delayed clock signal CLKD by delaying the clock signal CLK by the first delay period and generates the control pulse CP with the same cycle as the clock signal CLK from the delayed clock signal CLKD before the read operation. At this time, the high level pulse width of the control pulse CP is shorter than that of the clock signal CLK by the second delay period.

Referring to FIG. 4, in operation of the period setting unit 12, the read period signal OUT_EN is disabled to a low level when the first initialization unit 120 sets the node nd1 to a high level in response to the read pulse RDP of a low level and the initialization signal INI of a low level upon the power-up. The read period signal OUT_EN is continuously disabled to a low level since the node nd1 is periodically pulled up in response to the control pulse periodically being toggled according to the clock signal CLK and the read pulse RDP of a low level.

Referring to FIG. 5, the reset signal generating unit 20 generates an output signal of a low level through the NOR gate NR2 and generates the reset signal RS enabled to a low level through the inverter IV7 and the inversion and delay unit 202 in response to the read period signal OUT_EN. Therefore, the input control signal generating unit 220 initializes all of the first through fourth input control signals PIN<1:4> by disabling them to a low level in response to the reset signal RS, and the output control signal generating unit 222 initializes all of the first through fourth output control signals POUT<1:4> by disabling them to a low level in response to the reset signal RS.

Next, operation of the semiconductor memory device upon the read operation will be described.

Referring to FIGS. 2 and 3, in the operation of the control pulse generating unit 10, the control pulse CP is enabled to a high level when the read pulse RDP is inputted since the output signal of the NOR gate NR1 of the second logic unit 102 becomes a low level and the output signal of the NAND gate ND2 thus becomes a high level. After that, when the burst signal BST is enabled to a high level after lapse of one cycle period of the clock signal CLK, the NAND gate ND3 maintains the control pulse CP to a high level in response to the burst signal BST of a high level. At this time, the read pulse RDP is at a low level again. When the burst signal BST is disabled to a low level after the termination of the burst operation, the control pulse is disabled to a low level after the first delay period of the first delay unit 101 and the second delay period of the second delay unit 103 are elapsed.

The period setting unit 12 pulls down the node nd1 when the read pulse RDP is at a high level, and generates the read period signal OUT_EN enabled to a high level. After that, when the node nd1 is pulled up in response to the control pulse disabled to a low level after the burst operation is terminated and the first delay period and the second period are elapsed, the read period signal OUT_EN is disabled to a low level.

That is to say, the read period signal generating unit 1 generates the read period signal OUT_EN which is enabled to a high level upon the entry into the read operation and is disabled to a low level after the burst operation is terminated and the first delay period and the second period are elapsed.

Referring to FIG. 5, in operation of the reset signal generating unit 20, since the read-write flag signal RWF is at a low level, the level signal generating unit 200 outputs the level signal LS disabled to a low level during the high enable period of the read period signal OUT_EN, and the inversion and delay unit 202 inverts and delays the level signal LS and generates the reset signal RS in which the enable period of the read period signal OUT_EN is delayed. The reset signal generating unit 20 generates the reset signal RS also when the read-write flag signal RWF is shifted to a high level upon entry into the write operation. That is to say, the reset signal RS is enabled to a low level upon the entry into the write operation or when the enable period of the read period signal OUT_EN is terminated.

The input control signal generating unit 220 sequentially enables the first through fourth input control signals PIN<1:4> in response to the read strobe signal RSTB, and the output control signal generating unit 222 sequentially enables the first through fourth output control signals POUT<1:4> in response to the clock signal CLK. At this time, the pipe latch unit 24 sequentially latches the data transferred through the global line GIO in response to the first through fourth input control signal PIN<1:4>, and sequentially outputs the latched data LDATA in response to the first through fourth output control signals POUT<1:4>.

Meanwhile, when the reset signal RS is enabled to a low level by entry into the write operation or termination of the enable period of the read period signal OUT_EN, the first through fourth input control signals PIN<1:4> and the first through fourth output control signals POUT<1:4> are all initialized.

As should be apparent from the above description, the semiconductor memory device in accordance with an embodiment of the present invention initializes the first through fourth input control signals PIN<1:4> and the first through fourth output control signals POUT<1:4> after all of the data are substantially outputted to the outside in the read operation period, and thus prevents the read operation failure resulted from the mismatch of the first through fourth input control signals PIN<1:4> and the first through forth output control signals POUT<1:4> upon the next read operation.

While the present invention has been described with respect to the specific embodiments, it will be apparent to those skilled in the art that various changes and modifications may be made without departing from the spirit and scope of the invention as defined in the following claims.

The present disclosure claims priority to Korean application number 10-2009-0027001, filed on Mar. 30, 2009, the entire contents of which are incorporated herein by reference.

What is claimed is:

1. A pipe latch circuit, comprising:
a reset signal generating unit which receives a read-write flag signal and a read period signal and generates a reset signal, wherein the reset signal is enabled upon entry into a write operation or after all of data are outputted to an outside upon a read operation;
an input/output control signal generating unit which generates a plurality of input control signals and output control signals in response to a read strobe signal and a clock signal, and is reset in response to the reset signal; and
a pipe latch unit which latches inputted data in response to the input control signals and outputs the latched data in response to the output control signals.

2. The pipe latch circuit of claim 1, wherein the read-write flag signal is shifted to different levels upon the read operation and the write operation.

3. The pipe latch circuit of claim 1, wherein the read period signal is enabled upon entry into the read operation and is disabled after a burst operation is terminated and a predetermined period is elapsed.

4. The pipe latch circuit of claim 1, wherein the reset signal generating unit comprises:
a level signal generating unit which generates a level signal enabled upon the entry into the write operation or after all of the data are outputted to the outside upon the read operation; and
an inversion and delay unit which inverts and delays the level signal and generates the reset signal.

5. The pipe latch circuit of claim 1, wherein the input/output control signal generating unit comprises:
an input control signal generating unit which sequentially enables the input control signals in synchronization with the read strobe signal and disables all of the input control signals in response to the reset signal; and
an output control signal generating unit which sequentially enables the output control signals in synchronization with the clock signal and disables all of the output control signals in response to the reset signal.

6. The pipe latch circuit of claim 1, further comprising: a read period signal generating unit which receives the clock signal, a read pulse and a burst signal and generates a read period signal enabled upon entry into the read operation and disabled after all of the data are outputted to the outside.

7. The pipe latch circuit of claim 6, wherein the read pulse is generated when a read command is inputted.

8. The pipe latch circuit of claim 6, wherein the burst signal is enabled after the read pulse is inputted and one cycle period of the clock signal is elapsed, and is disabled after a burst operation is terminated and a predetermined period is elapsed.

9. The pipe latch circuit of claim 6, wherein the read period signal generating unit comprises:
a control pulse generating unit which receives the read pulse and the burst signal and generates a control pulse, the control pulse being enabled upon the entry into the read operation and disabled after a burst operation is terminated and a predetermined period is elapsed; and
a period setting unit which generates a read period signal in response to the read pulse and the control pulse.

10. The pipe latch circuit of claim 9, wherein the control pulse generating unit comprises:
a first logic unit which receives the clock signal and the burst signal and generates a delayed clock signal by delaying the clock signal by a first delay period; and
a second logic unit which receives the delayed clock signal and the read pulse and generates the control pulse by adjusting the delayed clock signal to have a pulse width shortened by a second delay period.

11. The pipe latch circuit of claim 9, wherein the period setting unit comprises:
a level setting unit which pulls down a node when the read pulse is inputted and pulls up the node when an enable period of the control pulse is terminated; and
a latch unit which latches a signal of the node and generates the read period signal.

12. A semiconductor memory device, comprising:
a read period signal generating unit which receives a read pulse, a clock signal and a burst signal and generates a read period signal, the read period signal being enabled upon entry into a read operation and disabled after all of data are outputted to an outside; and
a pipe latch circuit which controls input/output of the data in response to a read strobe signal and the clock signal and is initialized when the read period signal is disabled or upon entry into a write operation.

13. The semiconductor memory device of claim 12, wherein the read pulse is generated when a read command is inputted.

14. The semiconductor memory device of claim 12, wherein the burst signal is enabled after the read pulse is inputted and one cycle period of the clock signal is elapsed, and is disabled after the burst operation is terminated and a predetermined period is elapsed.

15. The semiconductor memory device of claim 12, wherein the read period signal generating unit comprises:
- a control pulse generating unit which receives the read pulse and the burst signal and generates a control pulse, the control pulse being enabled upon the entry into the read operation and disabled after a burst operation is terminated and a predetermined period is elapsed; and
- a period setting unit which generates a read period signal in response to the read pulse and the control pulse.

16. The semiconductor memory device of claim 15, wherein the control pulse generating unit comprises:
- a first logic unit which receives the clock signal and the burst signal and generates a delayed clock signal by delaying the clock signal by a first delay period; and
- a second logic unit which receives the delayed clock signal and the read pulse and generates the control pulse by adjusting the delayed clock signal to have a pulse width shortened by a second delay period.

17. The semiconductor memory device of claim 15, wherein the period setting unit comprise:
- a level setting unit which pulls down a node when the read pulse is inputted and pulls up the node when an enable period of the control pulse is terminated; and
- a latch unit which latches a signal of the node and generates the read period signal.

18. The semiconductor memory device of claim 12, wherein the pipe latch circuit comprises:
- a reset signal generating unit which receives a read-write flag signal and the read period signal and generates a reset signal, wherein the reset signal is enabled upon of the entry into the write operation or after all of data are outputted to an outside upon read operation;
- an input/output control signal generating unit which generates a plurality of input control signals and output control signals in response to a read strobe signal and the clock signal, and is reset in response to the reset signal; and
- a pipe latch unit which latches inputted data in response to the input control signals and outputs the latched data in response to the output control signals.

19. The semiconductor memory device of claim 18, wherein the read-write flag signal is shifted to different levels upon the read operation and the write operation.

20. The semiconductor memory device of claim 18, wherein the reset signal generating unit comprises:
- a level signal generating unit which generates a level signal enabled upon the entry into the write operation or after all of the data are outputted to the outside upon the read operation; and
- an inversion and delay unit which inverts and delays the level signal and generates the reset signal.

21. The semiconductor memory device of claim 18, wherein the input/output control signal generating unit comprises:
- an input control signal generating unit which sequentially enables the input control signals in synchronization with the read strobe signal and disables all of the input control signals in response to the reset signal; and
- an output control signal generating unit which sequentially enables the output control signals in synchronization with the clock signal and disables all of the output control signals in response to the reset signal.

* * * * *